United States Patent [19]

Ishikawa et al.

[11] Patent Number: 4,742,361
[45] Date of Patent: May 3, 1988

[54] THERMAL PRINT HEAD

[75] Inventors: Takatoshi Ishikawa; Masakazu Kato; Takehiro Takoshima; Yoshimi Kamijyo, all of Furukawa, Japan

[73] Assignee: Alps Electric Co., Ltd., Japan

[21] Appl. No.: 827,796

[22] Filed: Feb. 7, 1986

[30] Foreign Application Priority Data

Feb. 7, 1985 [JP] Japan .................................. 60-22188

[51] Int. Cl.[4] ...................... G01D 15/10; H01C 1/012; B05D 1/36
[52] U.S. Cl. ................................. 346/76 PH; 219/216; 338/308; 338/309; 427/58; 427/402; 427/404
[58] Field of Search .................... 346/76 PH; 338/308, 338/330; 427/58, 96, 89, 404, 402; 219/216

[56] References Cited

U.S. PATENT DOCUMENTS

| 3,321,727 | 5/1967 | Schrewelius | 338/330 |
| 4,042,479 | 8/1977 | Yamazaki et al. | 204/192 F X |
| 4,105,892 | 8/1978 | Tashiro et al. | 219/216 |

OTHER PUBLICATIONS

Condensed Chemical Dict., G. Hawley, pp. 743, 744, Van Nostrand Reinhold Co., 1980.

Primary Examiner—E. A. Goldberg
Assistant Examiner—Gerald E. Preston
Attorney, Agent, or Firm—Guy W. Shoup

[57] ABSTRACT

Disclosed is a thermal head in which a heat-generating resistor layer, a power feeding conductor layer, and a protecting film are formed on an electrically insulating substrate, the heat generating resistor layer being constituted by an alloy of tantalum, rare earth metals, and nitrogen.

Further disclosed is a method of producing a thermal head comprising the steps of forming a heat-generating resistor layer, a power feeding conductor layer, and a protecting film, on an electrically insulating substrate, the step of forming the heat-generating resistor layer including the step of performing spattering in mixed gases of argon and nitride to form the heat-generating resistor layer made of an alloy of tantalum, a rare earth metal material, and nitrogen, by using a composite target in which small pieces of the rare earth metal materials are disposed on a tantalum target.

4 Claims, 2 Drawing Sheets

THERMAL PRINT HEAD

BACKGROUND OF THE INVENTION

1. Field of the Invention

The present invention relates to a thermal head and a method of producing the same, and particularly relates to an improvement of a heat-generating resistor layer of the same.

2. Description of the Prior Art

Generally, a thermal head is constituted by a structure of lamination of a heat generating resistor layer for forming dot-like heat-generating bodies, a power feeding conductor layer for feeding the heat-generating resistor layer with electric power, and a protecting film for protecting these layers from oxidization and wear, formed on an electrically insulating substrate such as ceramics with the surface covered with, for example, a thin glass glaze layer.

Conventionally, a thin film of tantalum nitride has been used as the heat generating resistor layer. The tantalum nitride has such advantages that the heat-resisting property is superior, the temperature coefficient is small, and the tightness with the glass glaze layer which becomes foundation is good. In the pattern formation, etching can be easily performed with a mixed acid of nitric acid and hydrofluoric acid, or alternatively, dry etching can be performed by using $CF_4$ gas or the like.

On the other hand, in the case where the tantalum nitride thin film is used as a heat-generating resistor of the thermal head, the surface of the tantalum nitride thin film is generally covered with an anti-oxdization protecting layer made of a silicon oxide thin film, because the tantalum nitride thin film does not have sufficient anti-oxidization property against thermal oxidization. The tantalum nitride thin film and the silicon oxide thin film are extremely superior in tightness, so that the anti-oxidization property against the thermal oxidization of the tantalum nitride thin film may be increased sufficiently.

Even in the case where the tantalum nitride thin film is used as the heat-generating resistor of the thermal head, however, there have been the following problems.

A curve A in FIG. 1 shows the result of a step-stress test of a thermal head in which the conventional tantalum nitride thin film is used as a heat-generating resistor. The test is a kind of acceleration tests used generally for estimating the thermal stability of the thermal head, in which a suitable pulse voltage was applied to the heat generating resistor for a predetermined time and the change in resistance with respect to an initial value was measured. The applied voltage was gradually raised till the heat-generating resistor was burned out, and the rate of change in resistance in various steps was plotted. The conditions of the step-stress test were such that in the first step the resistance value is measured after a pulse voltage of 20 volts with a pulse width of 1 msec and a repetition pulse period of 20 msec was applied for ten minutes, and in the second step the pulse voltage was raised to 7.5 volts and the resistance value was measured after the pulse voltage was applied under the same condition as the first step. Then, the pulse voltage was successively raised by 0.5 volts every step until the rate of change in resistance $\Delta R/R$ exceeds 10%.

An upper horizontal axis in FIG. 1 shows the highest surface temperature at a heat generating portion with respect to various values of the applied voltage. An infrared ray spot thermometer was used for measuring the temperature. As shown by the curve A, in the conventional thermal head using the heat-generating resistor made of the tantalum nitride thin film the resistance value of the heat-generating resistor starts to comes down from a point where the applied power was about 22 W/mm$^2$ and the heat-generating resistor surface temperature was about 400° C. Now, the surface temperature at the heat-generating portion necessary to generate heat on a thermo-sensitive paper is about 350°–450° C. in an ordinary thermal printer. As the printing speed is made faster, the surface temperature of the heat-generating portion is required to be made higher to exceeds 500° C. In the case where printing is made by using the conventional thermal head using the heat-generating resistor made of the tantalum nitride, the printing density tended to gradually increase as the printing time passed. In some cases, the quality in printing was deteriorated due to printing bleeding, whitely coloring, or the like. These phenomena are caused by the reduction in the resistance value of the tantalum nitride heat-generating resistor at the high temperature as described above. Ordinarily, because the voltage applied to the thermal head is constant while the resistance value of the tantalum nitride heat-generating resistor decreases, the power to be supplied for the heat generation is relatively rapidly increased, so that the surface temperature at the heat-generating portion is raised excessively. Thus, the temperature exceeds the optimum coloring value on a heated paper, so that the quality of printing is deteriorated due to the printing bleeding or the like. Further, there is such a disadvantage that the heat-generating resistor may be burned out because of the undesirably unnecessarily high temperature.

SUMMARY OF THE INVENTION

It is therefore an object of the present invention to solve the problems in the heat-generating resistor of the above-mentioned conventional thermal head.

It is another object of the present invention to provide a thermal head in which a resistance value of a heat-generating resistor layer is less reduced at a high temperature and the thermal stability of the heat-generating resistor layer is improved.

It is a further object of the present invention is to provide a method of producing a thermal head of the type as described directly above.

According to an aspect of the present invention, the thermal head is featured in that a heat-generating resistor layer, a power feeding conductor layer, and a protecting film are formed on an electrically insulating substrate, the heat generating resistor layer being constituted by an alloy of tantalum, rare earth metals, and nitrogen.

According to another aspect of the present invention, the method of producing a thermal head comprising the steps of forming a heat-generating resistor layer, a power feeding conductor layer, and a protecting film, on an electrically insulating substrate, the step of forming the heat-generating resistor layer including the step of performing spattering in mixed gases of argon and nitride to form the heat-generating resistor layer made of an alloy of tantalum, a rare earth metal material, and nitrogen, by using a composite target in which small pieces of the rare earth metal material are disposed on a tantalum target.

Thus, according to the present invention, the heat-generating resistor is constituted by an alloy of tantalum, rare earth metals, and nitrogen, so that the reduction of the resistance value becomes less even at a high temperature and the thermal stability is extremely improved. Accordingly, the increase in printing density, printing bleeding, whitely coloring, or the like, are prevented from occurring so that the quality in printing can be improved even in printing for a long time,.

DETAILED DESCRIPTION OF PREFERRED EMBODIMENTS

Figure 2:
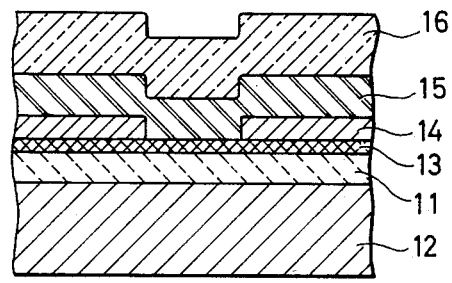
FIG. 2 is a cross-section showing a part of an embodiment of the thermal head according to the present invention.

FIG. 2 is a cross section showing a part of an embodiment of the thermal head according to the present invention.

A heat-generating resistor layer 13 made of an alloy of tantalum, rare earth metals, and nitrogen is formed on an insulating substrate 12 made of ceramics and covered on its surface with a thin glass glaze layer 11 of about 50 μm thick. The thickness of the heat-generating resistor layer 13 is about 0.05 μm–0.2 μm. Successively, a power feeding conductor layer 14 made of an aluminum film of 1–2 μm thick is formed and a pattern of the thermal head is formed by etching the heat-generating resistor layer 13 and the power feeding conductor layer 14 in succession. Then, the thermal head is formed by laminating in succession an anti-oxidization protecting film 15 made of silicon oxide of 2 μm thick and a wear-proof protecting film 16 made of tantalum oxide of several μm thick.

Next, the method of manufacturing the heat-generating resistor layer 13 will be described. The heat-generating resistor layer 13 according to the present invention is formed by using a spattering method.

Figure 3:
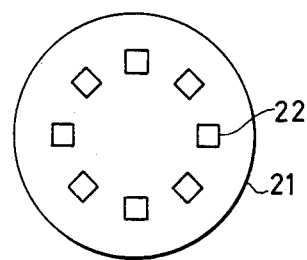
FIG. 3 is a plan view of a target used in the process of manufacturing the thermal head according to the present invention.

FIG. 3 is a plan view showing the structure of a target at that time. Rare earth metal tips 22, each of which is square 10 mm long at each side and 1–2 mm in thickness, are deposited on an upper surface of a disk-like tantalum target 21. The content of the rare earth metals in the alloy thin film formed may be adjusted by changing the number of tips 22. By using such a composite target, the thin film of alloy of tantalum, rare earth metals, and nitrogen may be formed by performing high-frequency magnetron spattering in a mixed gas atmosphere of argon gas having a partial pressure of 0.2 to 0.9 Pa ($1.5 \times 10^{-3}$ to $7.0 \times 10^{-3}$ Torr) and a nitrogen gas having a partial pressure of ($7.5 \times 10^{-5}$ to $4.0 \times 10^{-4}$ Torr) while heating a washed glazed alumina substrate at 100°–300° C. Further, the applied high-frequency power in spattering is 2–8 Watt per unit area ($cm^2$) of the target in spattering, and with the applied power of 3.9 W/$cm^2$ the film forming rate is about 160 Å per minute though there are some variations depending on the kind and the amount of the rare earth metals.

There occurs no reduction in resistance value in the heat generating portion of thermal head according to the present invention having the thus formed heat-generating resistor 13 until the temperature at the heat-generating portion becomes about 700° C. Accordingly, the heat-generating resistor layer 13 is superior in thermal stability and the quality of printing is never deteriorated even if the thermal head is used for a long time.

There is no particular difficulties in controlling in the manufacturing process, that is, in the steps of forming films and performing etching, and the film formation can be made as easily as the conventional tantalum nitride thin film formation, and therefore is suitable for mass-production. Particularly, the etching can be performed easily with a mixed acid of nitric acid and hydrofluoric acid in the same manner as the conventional tantalum nitride thin film.

Figure 4:
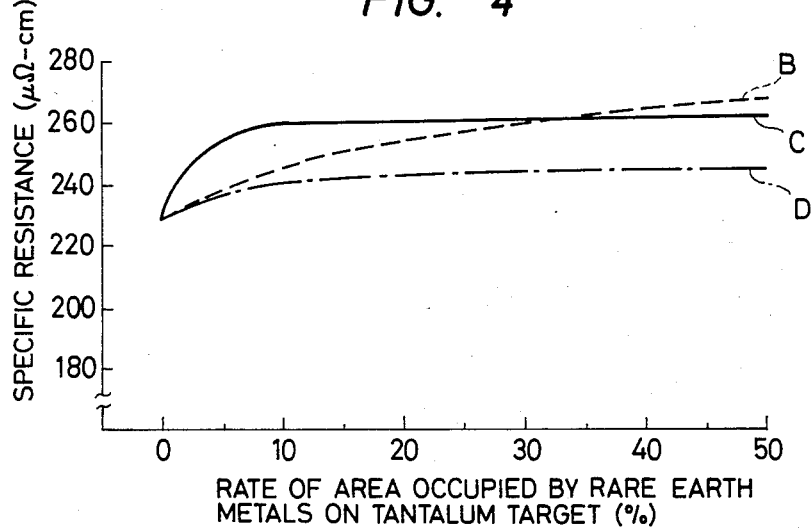
FIG. 4 is a characteristic diagram showing the relation between the rate of area occupied by rare earth metals on a tantalum target and specific resistance of a heat-generating resistor layer.
Figure 5:
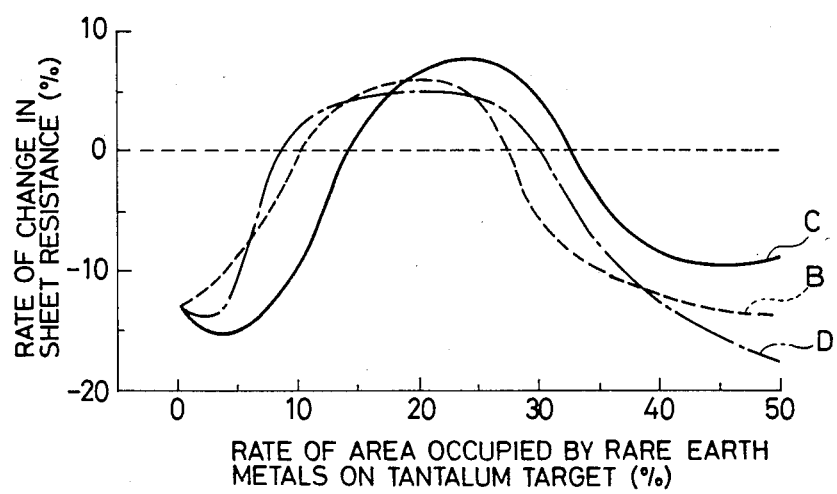
FIG. 5 is a characteristic diagram showing the relation between the above-mentioned rate of area occupied by rare earth metals and the rate of change in sheet resistance of the heat-generating resistor layer due to heat treatment.

FIG. 4 is a diagram showing the relation between the rate of area occupied by the rare earth metals on the tantalum target (indicating with % the rate of the area occupied by the rare earth metals to the area of the tantalum target) and the specific resistance with the argon partial pressure fixed at 0.6 Pa ($4.5 \times 10^{-3}$ Torr), the nitrogen partial pressure fixed at 0.015 Pa ($1.1 \times 10^{-4}$ Torr), the substrate temperature fixed at 200° C., and the applied high-frequency power fixed at 3.9 W/$cm^2$ among the above-mentioned conditions. FIG. 5 is a diagram showing the relation between the rate of change in sheet resistance ($\Delta R/R$ %) before and after heat treatment and the rate of the area occupied by the rare earth metals on the tantalum target, in the case where a sample of film of about 0.25 μm obtained by forming only a heat-generating resistor on a glazed alumina substrate in the same conditions as FIG. 4 is subject to heat-treatment at a temperature of 550° C. for an hour in a vacuum of about 0.03 Pa (about $2 \times 10^{-4}$ Torr). In FIG. 4 and 5, the case in which the rate of area occupied by the rear earth metals is 0% corresponds to the case of the conventional tantalum nitride thin film.

Figure 1:
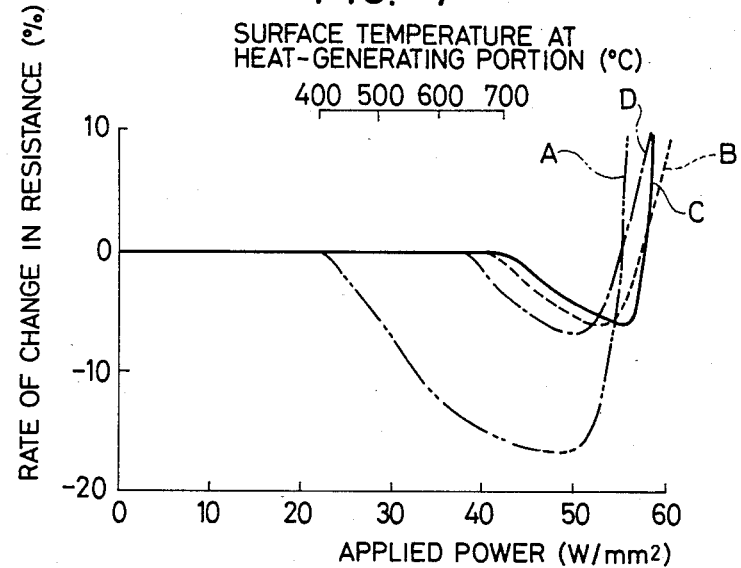
FIG. 1 is a graph showing the results of a step stress test for various kinds of thermal heads.

In FIGS. 1, 4, and 5, A, B, C, and D represent characteristic curves of the conventional tantalum nitride, of an alloy of tantalum, lanthanum, and nitrogen (sample B), of an alloy of tantalum, samarium, and nitrogen (sample C), and of an alloy of tantalum, cerium, and nitrogen (sample D), respectively.

Next, the characteristics of the alloys of tantalum, rare earth metals, and nitrogen (samples B-D) according to the present invention will be individually described.

(SAMPLE B)

As shown by the curve B in FIG. 4, although the specific resistance becomes gradually large as the rate of area occupied by lanthanum increases, there is no practical problem. As shown by the curve B in FIG. 5, the rate of change in sheet resistance for the heat treatment at 550° C. for an hour is within +10% in the case where the rate of area occupied by lanthanum is within 5–30%. Thus, the sample B is superior in thermal stability to the conventional case of tantalum nitride where the rate of change in sheet resistance is −12%. Further, the rate of area occupied by lanthanum is preferable to be in a range of 7–15% or a range of 25–30% such that the rate of change in sheet resistance becomes within +5%.

The curve B in FIG. 1 shows the result of the step-stress test for the thermal head in which the heat-generating resistor is made of the alloy thin film of tantalum, lanthanum, and nitrogen in which the rate of area occupied by lanthanum is settled to be 10% in the above-mentioned spattering conditions. Apparently from the diagram, the temperature at which the resistance value starts to reduce is extremely improved so as to be raised by about 300° C. to reach about 700° C., resulting in extremely high thermal stability, in comparison with the conventional tantalum thin film (curve A).

(SAMPLE C)

As shown by the curve C in FIG. 4, although the specific resistance increases gradually large until the rate of area occupied by samarium reaches 10%, it becomes constant after the rate of area exceeds 10% so that the conditions for spattering can be easily controlled. As seen from the curve C in FIG. 5, the rate of change in sheet resistance of the heat treatment at 550° C. for an hour is within +10% in the case where the rate of area occupied by samarium is within 10–40%. Thus, the sample C is superior in thermal stability to the conventional case of tantalum nitride where the rate of change in sheet resistance is −12%. Further, the rate of area occupied by samarium is preferable to be in a range of 12–18% or a range of 30–36% such that the rate of change in sheet resistance becomes within +5%.

The curve C in FIG. 1 shows the result of the step-stress test for the thermal head in which the heat-generating resistor is made of the alloy thin film of tantalum, samarium, and nitrogen in which the rate of area occupied by samarium is settled to be 14% in the above-mentioned spattering conditions. Also in the case of the thin film of this alloy, similarly to the case of the above-mentioned thin film of alloy of tantalum, lanthanum, and nitrogen, and temperature at which the resistance value starts to reduce is extremely improved so as to be raised by about 300° C. to reach about 700° C., resulting in extremely high thermal stability, in comparison with the conventional tantalum thin film (curve A).

(SAMPLE D)

As shown by the curve D in FIG. 4, the specific resistance is kept substantially constant even if the rate of area occupied by cerium increases and the spattering conditions can be easily controlled, in the case of the thin film of alloy of tantalum, cerium, and nitrogen. As seen from the curve D in FIG. 5, the rate of change in sheet resistance for the heat treatment at 550° C. for an hour is within +10% in the case where the rate of area occupied by cerium is within 5–40%. Thus, the sample D is superior in thermal stability to the conventional case of tantalum nitride where the rate of change in sheet resistance is −12%. Further, the rate of area occupied by samarium is preferable to be in a range of 7–18% or a range of 25–32% such that the rate of change in sheet resistance becomes within +5% so that the thin film can be fit for use at a temperature of 500° C. or more.

The curve D in FIG. 1 shows the result of the step-stress test for the thermal head with the heat-generating resistor made of the alloy thin film of tantalum, cerium, and nitrogen in which the rate of area occupied by cerium is settled to be 9% in the above-mentioned spattering conditions. As apparent from this drawing, also in this alloy thin film, the temperature at which the resistance value starts to reduce is extremely improved so as to be raised by about 250° C. to reach about 650° C., resulting in extremely high thermal stability, in comparison with the conventional tantalum thin film (curve A).

As described above, according to the present invention, the heat-generating resistor layer is constituted by an alloy of tantalum, rare earth metals, and nitrogen, so that the resistance value thereof does not decrease till the surface temperature at the heat-generating portion reaches about 700° C. and the thermal stability is extremely high. Therefore, there is no occurrence of increase in printing density, printing bleeding, whitely coloring, etc., in printing for a long time, so that the quality of printing is improved. Besides, the heat-generating resistor layer made of the alloy of tantalum, rare earth metals, and nitrogen may be film-formed and etched in the same manner as the conventional case of tantalum nitride, and the manufacturing process does not become complicate in comparison with the conventional case.

What is claimed is:

1. A thermal head comprising a heat-generating resistor layer, a power feeding conductor layer, and a protecting film, said layers and said film being formed on an electrically insulating substrate, said heat-generating resistor layer being made of an alloy of the elements of tantalum, a rare earth metal, and nitrogen.

2. A thermal head according to claim 1, in which said rare earth metal includes at least one kind of metal selected from a group consisting of lanthanum, samarium, and cerium.

3. A thermal head according to claim 1, wherein the rare earth metal ratio of said heat-generating resistor layer has the characteristic that, in step stress testing, no substantial rate of change in resistance occurs up to an applied power of about 40 Watts/mm.

4. A thermal head according to claim 1, the rare earth metal ratio of wherein said heat-generating resistor layer has the characteristic that, in step stress testing, no substantial rate of change in resistance occurs up to a surface temperature generated at said resistor layer of about 650° C. or higher.

* * * * *